United States Patent
Kennedy

(10) Patent No.: US 8,847,137 B2
(45) Date of Patent: Sep. 30, 2014

(54) SINGLE PACKAGE IMAGING AND INERTIAL NAVIGATION SENSORS, AND METHODS OF MANUFACTURING THE SAME

(75) Inventor: Marc Adam Kennedy, Kitchener (CA)

(73) Assignee: BlackBerry Limited, Waterloo, Ontario (CA)

( * ) Notice: Subject to any disclaimer, the term of this patent is extended or adjusted under 35 U.S.C. 154(b) by 244 days.

(21) Appl. No.: 13/407,798

(22) Filed: Feb. 29, 2012

(65) Prior Publication Data
US 2013/0221195 A1 Aug. 29, 2013

(51) Int. Cl.
*H01L 31/18* (2006.01)

(52) U.S. Cl.
USPC ................................ 250/208.1; 257/415

(58) Field of Classification Search
USPC ........... 250/208.1; 257/415, 698; 438/15, 125
See application file for complete search history.

(56) References Cited

U.S. PATENT DOCUMENTS

| | | | |
|---|---|---|---|
| 7,335,971 B2 | 2/2008 | Funk | |
| 7,875,942 B2 * | 1/2011 | Cortese et al. | 257/415 |
| 2006/0251410 A1 | 11/2006 | Trutna | |
| 2007/0027591 A1 | 2/2007 | Goldenberg et al. | |
| 2007/0064144 A1 | 3/2007 | Trutna et al. | |
| 2008/0157388 A1 | 7/2008 | Han | |
| 2008/0245148 A1 | 10/2008 | Fukumoto | |
| 2010/0181589 A1 * | 7/2010 | Huang et al. | 257/98 |
| 2011/0069229 A1 | 3/2011 | Lord | |
| 2011/0141276 A1 * | 6/2011 | Borghei | 348/143 |
| 2011/0157017 A1 | 6/2011 | Webb et al. | |
| 2011/0279453 A1 | 11/2011 | Murphy et al. | |

FOREIGN PATENT DOCUMENTS

WO WO2011118116 9/2011

OTHER PUBLICATIONS

Document related to EP Application No. 12157448.7 dated Jul. 5, 2012 (European Search Report).
Document relating to EP Application No. 12157448.7, dated Feb. 4, 2014 (Response to Search Report).
Document relating to EP Application No. , dated Mar. 28, 2014 (EP Communication Pursuant to Article 94(3) EPC).
Document relating to EP Application No. 12157448.7, dated Jul. 17, 2014 (Response to Search Report).

\* cited by examiner

*Primary Examiner* — Tony Ko
(74) *Attorney, Agent, or Firm* — Bereskin & Parr LLP/S.E.N.C.R.L., s.r.l.

(57) ABSTRACT

Apparatus and methods of manufacturing an image sensor and inertial navigation sensors encapsulated within a single package. The single package may encapsulate one integrated circuit die comprising the imaging sensor and the inertial navigation sensors. Alternatively, the single package may encapsulate a plurality of integrated circuit dice comprising the imaging sensor and the inertial navigation sensors.

19 Claims, 9 Drawing Sheets

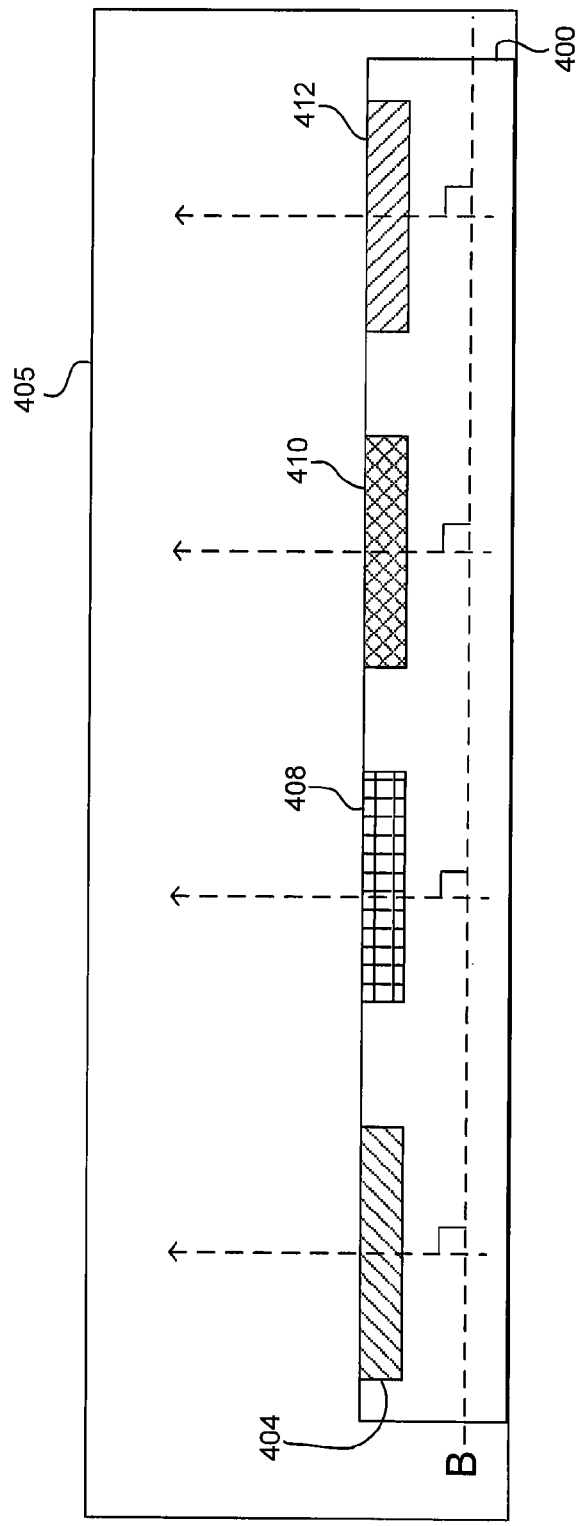

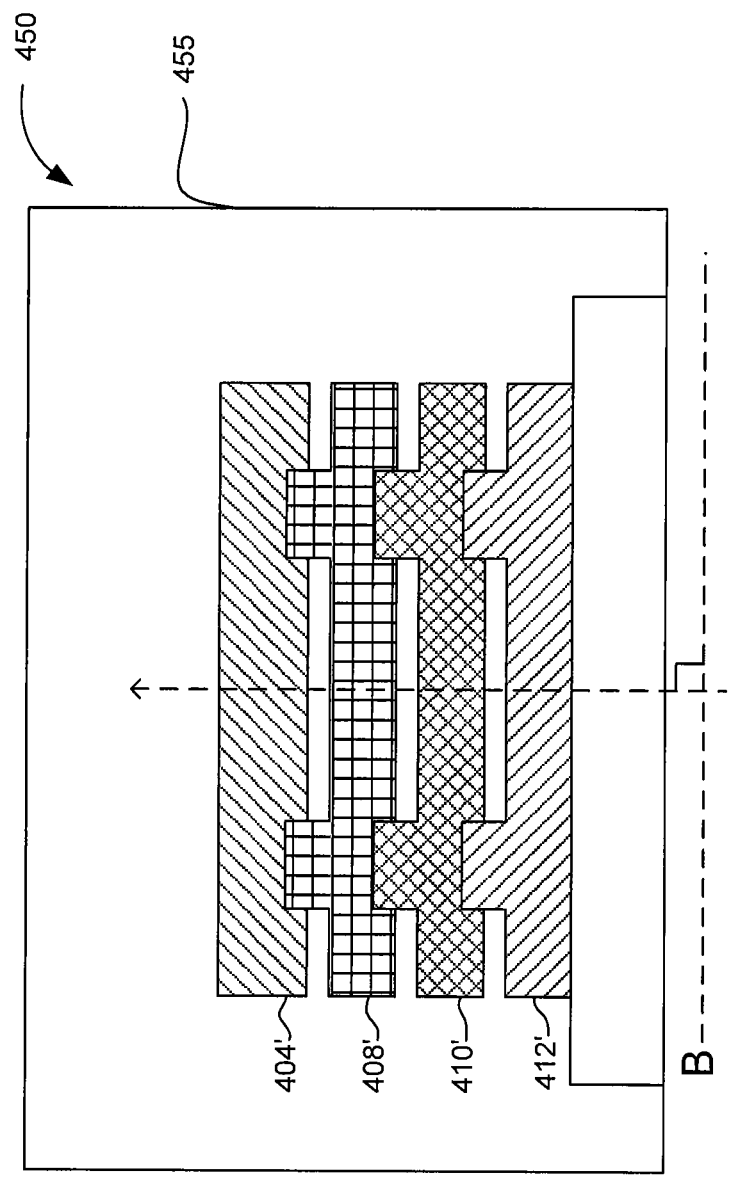

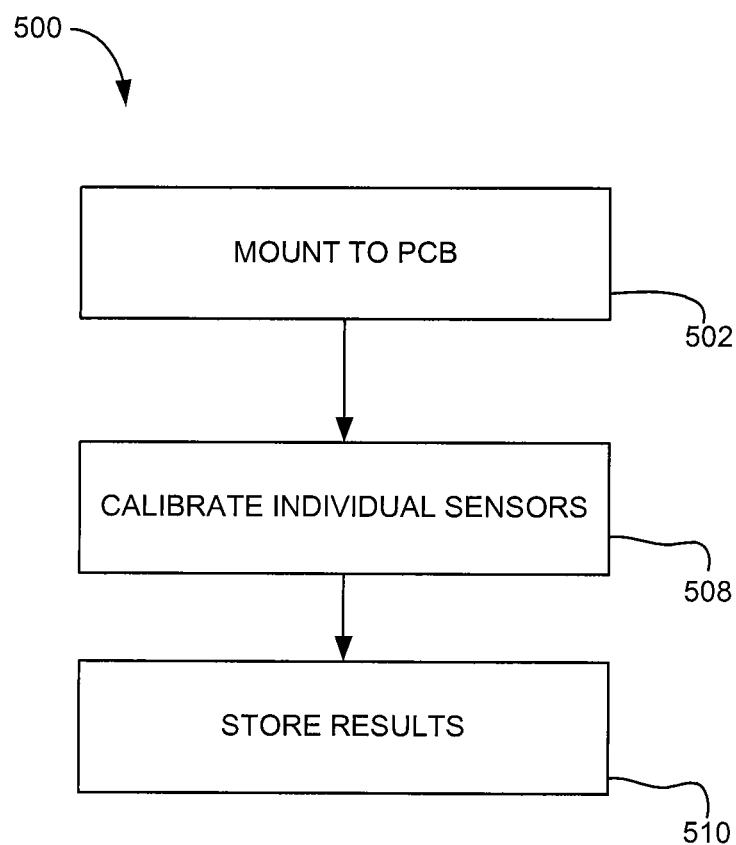
FIG. 6
(conventional)

SINGLE PACKAGE IMAGING AND INERTIAL NAVIGATION SENSORS, AND METHODS OF MANUFACTURING THE SAME

FIELD

The various embodiments described herein generally relate to imaging and navigational sensors and, in particular, to integrated circuits incorporating the same.

INTRODUCTION

Augmented reality (AR) is commonly used to describe a process of displaying a live view of a real world environment with additional, typically computer-generated, elements overlaid on the live view to provide additional feedback to a viewer. For example, the computer-generated elements may include video, images or textual data. In some cases, certain computer-generated elements may be visually overlaid over portions of the live view to emphasize or occlude desired features of the live view.

AR is commonly used to augment the real world environment with a wide variety of information (e.g., speed, directional bearing, points of interest, street names and addresses, etc.) to improve a user's understanding of the images being viewed. For example, a mobile device may capture live video using a camera and display the live video on a display of the mobile device. The mobile device may in some cases detect fiduciary markers (e.g., objects or features that may be used as points of reference) in the video indicating locations where computer-generated elements should be overlaid.

DRAWINGS

For a better understanding of the various embodiments described herein, and to show more clearly how these various embodiments may be carried into effect, reference will be made, by way of example, to the accompanying drawings which show at least one example embodiment, and in which:

FIG. 5A is a sectional view of an example single package sensor comprising a single integrated circuit die in accordance with at least one embodiment;

FIG. 5B is a sectional view of an example single package sensor comprising multiple integrated circuit dice in accordance with at least one embodiment;

FIG. 6 is a flow chart illustrating a conventional process for manufacturing camera and inertial navigation sensor modules.

DESCRIPTION OF VARIOUS EMBODIMENTS

Figure 1:
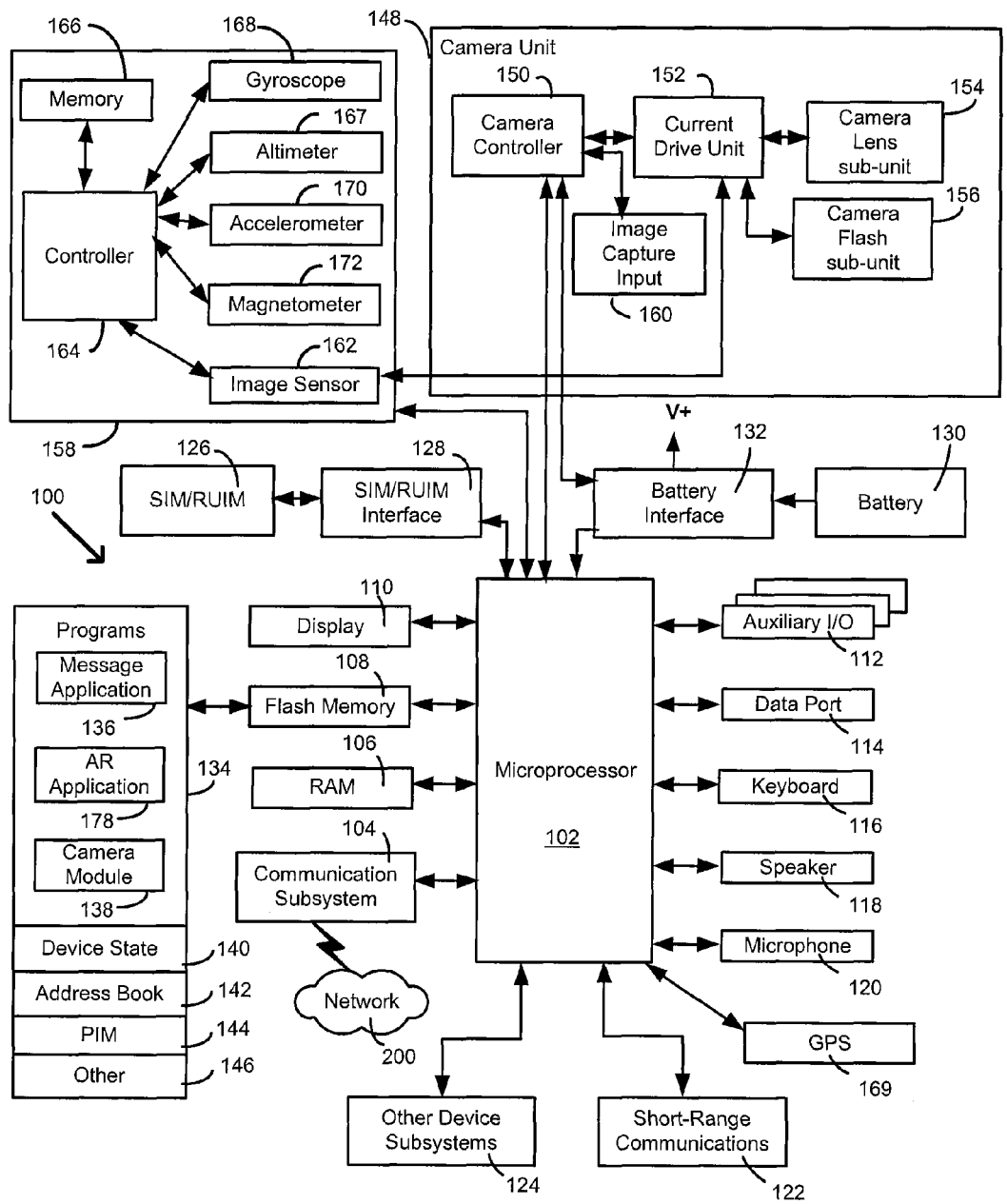
FIG. 1 is a block diagram of a mobile device in one example embodiment.

It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein. It should also be noted that the term coupled indicates that two elements can be directly connected to one another, or connected to one another through one or more intermediate elements.

In a broad aspect, there is provided a sensor apparatus for use in a mobile device comprising: an image sensor; at least one navigation sensor, the at least one navigation sensor comprising at least a magnetometer; and an integrated circuit package, wherein the integrated circuit package encapsulates the image sensor and the at least one navigation sensor. In some cases, the at least one navigation sensor may comprise at least an altimeter, an accelerometer, or a gyroscope, rather than the magnetometer.

The image sensor may be fabricated on a first integrated circuit die. The first integrated circuit die may be attached to the integrated circuit package. The at least one navigation sensor may also be fabricated on the first integrated circuit die.

The at least one navigation sensor may be fabricated on at least one additional integrated circuit die that is separate from the first integrated circuit die. The at least one additional integrated circuit die may be stacked with the first integrated circuit die.

The at least one navigation sensor may comprise two or more navigation sensors. The at least one navigation sensor may comprise at least one additional sensor selected from the group consisting of: a gyroscope, an accelerometer, and an altimeter. The at least one navigation sensor may also comprise a magnetometer.

In another broad aspect, there is provided a mobile device comprising: a sensor apparatus for use in the mobile device, the sensor apparatus comprising: an image sensor; at least one navigation sensor, the at least one navigation sensor comprising at least a magnetometer; and an integrated circuit package, wherein the integrated circuit package encapsulates the image sensor and the at least one navigation sensor. In some cases, the at least one navigation sensor may comprise at least an altimeter, an accelerometer, or a gyroscope, rather than the magnetometer.

In another broad aspect, there is provided a method of manufacturing a sensor apparatus for use in a mobile device, the method comprising: fabricating an image sensor; fabricating at least one navigation sensor, the at least one navigation sensor comprising at least a magnetometer; and encapsulating the image sensor and the at least one navigation sensor in an integrated circuit package. In some cases, the at least one navigation sensor may comprise at least an altimeter, an accelerometer, or a gyroscope, rather than the magnetometer.

The image sensor may be fabricated on a first integrated circuit die. The first integrated circuit die may be attached to the integrated circuit package. The at least one navigation sensor may also be fabricated on the first integrated circuit die.

The at least one navigation sensor may be fabricated on at least one additional integrated circuit die that is separate from the first integrated circuit die. The at least one additional integrated circuit die may be stacked with the first integrated circuit die.

The at least one navigation sensor may comprise two or more navigation sensors. The at least one navigation sensor may comprise at least one additional sensor selected from the group consisting of: a gyroscope, an accelerometer, and an altimeter. The at least one navigation sensor may also comprise a magnetometer.

In another broad aspect, there is provided a use of a sensor apparatus in a mobile device to provide output data to an augmented reality application executed by a processor of the mobile device, the sensor apparatus comprising: an image sensor; at least one navigation sensor; and an integrated circuit package, wherein the integrated circuit package encapsulates the image sensor and the at least one navigation sensor.

Similarly, there is provided a use of a sensor apparatus in a mobile device to provide output data to a navigation application executed by a processor of the mobile device, the sensor apparatus comprising: an image sensor; at least one navigation sensor; and an integrated circuit package, wherein the integrated circuit package encapsulates the image sensor and the at least one navigation sensor.

The image sensor and the at least one navigation sensor may provide the output data.

The at least one navigation sensor may comprise at least one additional sensor selected from the group consisting of: a gyroscope, an accelerometer, a magnetometer and an altimeter.

Inertial navigational sensors (e.g., magnetometer, accelerometer, gyroscope, altimeter) can be used to provide spatial orientation and movement information associated with a mobile device. Spatial orientation information generally comprises information related to the location of the device, and its orientation, relative to an external frame of reference (e.g., the earth). Movement information generally comprises information about the acceleration and movement of the device in three-dimensional space over time. Spatial orientation and movement information can be used to determine which computer-generated elements should be visually overlaid on live video, and the precise positioning of the overlay on the display. For example, in a navigation application for a mobile device, street names and a directional arrow may overlay a live video image taken by the mobile device, to provide augmented navigational directions for a user. The overlay can be positioned such that the computer-generated street name coincides with its corresponding element (the image of the street) in the live video.

AR systems may employ one or more sensors, including image sensors or other optical sensors, accelerometers, gyroscopes, magnetometers, altimeters and Global Positioning System (GPS). The accuracy, precision and calibration of each of these devices may determine how accurately AR overlay elements can be positioned in a live video.

AR software is generally operable to correlate these real world coordinates with an image captured by a camera or image sensor using a process called image registration. To perform image registration, the AR software generally uses knowledge of the position of the mobile device (e.g., latitude, longitude, elevation, etc.) and its orientation in three-dimensional space relative to an external frame of reference (e.g., laying on a flat surface, held vertically or obliquely by a user, etc.). The orientation may be determined relative to a camera of the mobile device. That is, the mobile device may be considered to be "facing" or "pointing" in the same direction as the image sensing surface of an image sensor of the mobile device (e.g., parallel to the principal axis of a camera lens of the mobile device).

AR performance may be measured in terms of bearing error and camera error. Bearing error can be defined as the deviation between the location and orientation information determined by the on-board sensors of the mobile device, and the objective location and orientation of the mobile device (e.g., relative to an external frame of reference with a common coordinate system). Camera error can be defined as the deviation between the orientation of the camera lens and the orientation of the on-board sensors of the mobile device.

Accuracy and performance of the positioning of visual overlays by AR software can be limited by several factors, including in particular, physical placement of individual sensors and their relative alignment on a printed circuit board (PCB). In particular, accurate alignment of an image sensor with other inertial navigation sensors (INS) such as magnetometers, gyroscopes and accelerometers can have a significant effect on accuracy and performance.

Existing manufacturing techniques for mobile devices, which may be configured for AR applications, typically employ individual sensors packaged as discrete components (i.e., in separate packages). Traditionally, mobile devices have a camera sensor that is inserted into a mating socket. This socket is either soldered to a printed circuit board or a flexible printed circuit board and/or made part of a sub-assembly such as the rear housing of the mobile device.

Similarly, each inertial navigation sensor may also be packaged and soldered to the printed circuit board. Typically, the different inertial navigation sensors are packaged and soldered to the printed circuit board independently of each other.

Even with precise packaging, mounting and soldering, this manner of manufacturing can result in small deviations in alignment and orientation of the different sensors when assembled. An alignment deviation can occur, for example, if a sensor is soldered to the PCB (or packaged) such that it is positioned at an angle other than the intended angle—the intended angle is typically a right angle—relative to the PCB (or package). Similarly, an orientation deviation can occur, for example, if a package is seated in a socket at a slight angle such that some pins of the package are more deeply inserted into the socket than others. Even such small deviations can result in significant bearing or camera errors that can negatively impact AR software. This is because sensor values may be cross-correlated to determine the orientation of a mobile device in space; as such, errors can be multiplied when computing the orientation.

Calibration of sensors to determine, for example, sensitivity, gain and bias, is similarly important. Improper calibration can also result in errors that can negatively impact AR software. Moreover, the calibration performed when an inertial navigation sensor is first fabricated may be insufficient to determine the appropriate calibration characteristics once the sensor is mounted in a package that is soldered to a PCB or inserted in a housing, for the reasons noted above and described further herein.

Accordingly, ensuring proper alignment and calibration may involve costly manufacturing or calibration processes, or both. Moreover, post-mounting calibration of each sensor can require further costly calibration techniques to ensure that the combined system functions accurately relative to an external frame of reference.

An additional issue may arise when inertial navigation sensors and image sensors are sourced from more than one manufacturer. For example, Company A may produce image sensors for use in mobile devices. Company B may produce magnetometers. Company C may produce gyroscropes and accelerometers. Given the different fabrication steps required and performance characteristics for each of the various inertial navigation and image sensors, it is common to use disparate fabrication processes. For example, an image sensor may be fabricated using a 0.45 µm complementary metal oxide semiconductor (CMOS) lithographic fabrication process suitable for imaging purposes, whereas an accelerometer may be fabricated using a 0.8 µm CMOS fabrication process adapted for producing microelectromechanical system (MEMS) devices.

As a result, image sensors and navigation sensors are typically provided in separate device packages. For the specific application of image stabilization, an image sensor and gyroscope may be sometimes provided within the same module.

Moreover, many manufacturers may calibrate sensors only at the die level—prior to placement in a semiconductor package—in some cases with dozens or hundreds of sensors calibrated at the same time in a specialized testing and calibration device.

Use of disparate fabrication processes for each of the different sensors enables each individual sensor to be fabricated cheaply and reliably. Moreover, manufacturers of mobile devices that use the individual sensors have flexibility in choosing suppliers for each of the individual sensors, allowing them to select sensors based on performance, cost and other factors.

In at least some embodiments there is described an imaging sensor with navigation sensors integrated on a single die. The navigation sensors can be integrated into the body fixture of the imaging sensor, packaged, and calibrated as a system, before or after incorporation into a mobile device.

In at least some other embodiments, there is described an imaging sensor with individual sensor dice provided within a single integrated circuit package or assembly.

The provision and use of a single package image sensor and navigation sensor (e.g., magnetometer, gyroscope, accelerometer and/or altimeter), as described herein, for navigation purposes or augmented reality purposes appears to be novel.

Moreover, calibration of the single package (or single integrated circuit) sensor array can be considerably simplified. For example, the need for a separate calibration of individual sensors relative to each other can be minimized or eliminated. Furthermore, the need for a separate model for each type of mobile device in which the sensors will be used can also be eliminated. Rather, because the single package comprises the image sensor and inertial navigation sensors, it can be accurately tested independently of the mobile device.

Furthermore, when the sensors are provided in a single integrated circuit, the requirement to position and solder each individual sensor may be eliminated. In an integrated circuit, individual sensors can be aligned with less than 0.1° deviation in orientation during fabrication.

By combining each sensor into a common integrated circuit, bearing error due to the separate rotation/orientation of each individual sensor can be minimized or even eliminated. The integrated imaging sensor can thus more accurately measure movement and rotation in six degrees of freedom.

Likewise, by combining separate sensors into a common package using precise alignment of the respective integrated circuit dice, bearing error due to the separate rotation/orientation of each individual sensor also can be minimized or even eliminated. The combined imaging sensor package can thus more accurately measure movement and rotation in six degrees of freedom.

As noted, the single package sensor can be pre-calibrated as a system, simplifying or eliminating the need for subsequent calibration when the package is incorporated in the mobile device.

Pre-calibration may provide significant manufacturing cost savings by eliminating the need for development and replication of individual calibration and test systems for each sensor component and each mobile device model.

To aid the reader in understanding the structure of the mobile device, reference will be made to FIGS. 1 to 3. However, it should be understood that the embodiments described herein are not limited to a mobile device but can be extended to any electronic device that includes an image sensor and navigational sensor. Examples of such electronic devices generally include any portable electronic device such as cellular phones, cellular smart-phones, wireless organizers, personal digital assistants, computers, laptops, handheld wireless communication devices, wireless enabled notebook computers, tablet computers or e-readers, electronic security devices, wireless Internet appliances and the like. The electronic devices listed herein which are mobile are generally portable and thus are battery-powered and may have limited processing power. While some of these devices include wireless communication capability, others are standalone devices that do not communicate with other devices.

Referring to FIG. 1, shown therein is a block diagram of one example of a mobile device 100. The mobile device 100 comprises a number of components, the controlling component being a microprocessor 102, which controls the overall operation of the mobile device 100. Communication functions, including data and voice communications, are performed through a communication subsystem 104. The communication subsystem 104 receives messages from and sends messages to a wireless network 200. In this example, the communication subsystem 104 is configured in accordance with the Global System for Mobile Communication (GSM) and General Packet Radio Services (GPRS) standards. In other embodiments, the communication subsystem 104 can be configured in accordance with other communication standards. New standards are still being defined, but it is believed that they will have similarities to the network behaviour described herein, and it will also be understood by persons skilled in the art that the various embodiments described herein should be able to be adapted to work with any other suitable standards that are developed in the future. The wireless link connecting the communication subsystem 104 with the wireless network 200 represents one or more different Radio Frequency (RF) channels, operating according to defined protocols specified for GSM/GPRS communications. With newer network protocols, these channels are capable of supporting both circuit-switched voice communications and packet-switched data communications.

Although the wireless network 200 associated with the mobile device 100 is a GSM/GPRS wireless network in this example, the mobile device 100 can be adapted to use other wireless networks in variant embodiments. For example, the different types of wireless networks that can be employed include, but are not limited to, data-centric wireless networks, voice-centric wireless networks, and dual-mode networks that can support both voice and data communications over the same physical base stations. Examples of networks also include, but are not limited to, Code Division Multiple Access (CDMA), CDMA2000 networks, GSM/GPRS networks, 3G networks like EDGE, W-CDMA and UMTS, 4G/LTE networks and future technologies such as 5G networks. Some other examples of data-centric networks include WiFi 802.11, Mobitex™ and DataTAC™ network communication systems. Examples of voice-centric data networks include Personal Communication Systems (PCS) networks like GSM and Time Division Multiple Access (TDMA) systems. Examples of communication protocols/standards that the mobile device 100 can be adapted to be used with include, but are not limited to, 3GPP and 3GPP2, High-Speed Packet Access (HSPA) standards such as High-Speed Downlink Packet Access (HSDPA), 3GPP LTE, LTE, LTE Advanced, WiMax, and Flash-OFDM.

The microprocessor 102 also interacts with additional subsystems such as a Random Access Memory (RAM) 106, a flash memory 108, a display 110, an auxiliary input/output (I/O) subsystem 112, a data port 114, a keyboard 116, a speaker 118, a microphone 120, short-range communications subsystem 122 and other device subsystems 124.

Some of the subsystems of the mobile device 100 perform communication-related functions, whereas other subsystems can provide "resident" or on-device functions. By way of example, the display 110 and the keyboard 116 can be used for both communication-related functions, such as entering a text message for transmission over the network 200, and device-resident functions such as a calculator or task list. Operating system software used by the microprocessor 102 is typically stored in a persistent store such as the flash memory 108, which can alternatively be a non-volatile memory (e.g., ROM, NVRAM, etc.) or similar storage element (not shown). Those skilled in the art will appreciate that the operating system, specific device applications, or parts thereof, can be temporarily loaded into a volatile store such as RAM 106.

The mobile device 100 may send and receive communication signals over the wireless network 200 after network registration or activation procedures have been completed. Network access is associated with a subscriber or user of the mobile device 100. To identify a subscriber, the mobile device 100 may use a SIM/RUIM card 126 (i.e. Subscriber Identity Module or a Removable User Identity Module) to be inserted into a SIM/RUIM interface 128 in order to communicate with a network. The SIM card or RUIM 126 is one type of a conventional "smart card" that can be used to identify a subscriber of the mobile device 100 and to personalize the mobile device 100, among other things. Without the SIM card 126, the mobile device 100 may not be fully operational for communication with the wireless network 200. By inserting the SIM card/RUIM 126 into the SIM/RUIM interface 128, a subscriber can access subscribed services. Services can include: web browsing and messaging such as e-mail, voice mail, SMS, and MMS. More advanced services can include: point of sale, field service and sales force automation. The SIM card/RUIM 126 includes a processor and memory for storing information. Once the SIM card/RUIM 126 is inserted into the SIM/RUIM interface 128, it is coupled to the microprocessor 102. In order to identify the subscriber, the SIM card/RUIM 126 contains some user parameters such as an International Mobile Subscriber Identity (IMSI). An advantage of using the SIM card/RUIM 126 is that a subscriber is not necessarily bound by any single physical mobile device. The SIM card/RUIM 126 can store additional subscriber information for a mobile device as well, including datebook (or calendar) information and recent call information. Alternatively, user identification information can also be programmed into the flash memory 108.

The mobile device 100 may be a battery-powered device, include a battery interface 132, and use one or more rechargeable batteries in a battery unit 130. The battery interface 132 is coupled to a regulator (not shown), which assists the battery unit 130 in providing power V+ to the mobile device 100. Alternatively, the battery unit 130 can be a smart battery as is known in the art. Smart batteries generally include a battery processor, battery memory, switching and protection circuitry, measurement circuitry and a battery pack that includes one or more batteries, which are generally rechargeable. In either case, the one or more batteries in the battery unit 130 can be made from lithium, nickel-cadmium, lithium-ion, or other suitable composite material.

The microprocessor 102, in addition to its operating system functions, enables execution of software applications 134 on the mobile device 100. The subset of software applications 134 that control basic device operations, including data and voice communication applications, will normally be installed on the mobile device 100 during its manufacture. When the microprocessor 102 is executing any of the software applications 134, the microprocessor 102 can be considered to be configured to execute a number of steps according to the methods specified by the code of the software applications 134.

The software applications 134 may include a message application 136 that can be any suitable software program that allows a user of the mobile device 100 to send and receive electronic messages. Various alternatives exist for the message application 136 as is well known to those skilled in the art. Messages that have been sent or received by the user are typically stored in the flash memory 108 of the mobile device 100 or some other suitable storage element in the mobile device 100. In an alternative embodiment, some of the sent and received messages can be stored remotely from the device 100 such as in a data store of an associated host system that the mobile device 100 communicates with. For instance, in some cases, only recent messages can be stored within the device 100 while the older messages can be stored in a remote location such as the data store associated with a message server. This can occur when the internal memory of the device 100 is full or when messages have reached a certain "age", i.e. messages older than 3 months can be stored at a remote location. In an alternative embodiment, all messages can be stored in a remote location while only recent messages can be stored on the mobile device 100.

The mobile device 100 may further include components such as a camera module 138, a device state module 140, an address book 142, a Personal Information Manager (PIM) 144, and other modules 146. The camera module 138 is used to control the camera operation for the mobile device 100, which includes obtaining raw thumbnail image data associated with images taken by an image sensor of the mobile device 100, preprocessing the raw thumbnail image data, and displaying the processed thumbnail image data on the display 110. The operation of the camera module 138 is discussed in further detail below.

The device state module 140 provides persistence, i.e. the device state module 140 ensures that important device data is stored in persistent memory, such as the flash memory 108, so that the data is not lost when the mobile device 100 is turned off or loses power. The address book 142 provides information for a list of contacts for the user. For a given contact in the address book 142, the information can include the name, phone number, work address and email address of the contact, among other information. The other modules 146 can include a configuration module (not shown) as well as other modules that can be used in conjunction with the SIM/RUIM interface 128.

The PIM 144 has functionality for organizing and managing data items of interest to a subscriber, such as, but not limited to, e-mail, calendar events, voice mails, appointments, and task items. A PIM application has the ability to send and receive data items via the wireless network 200. PIM data items can be seamlessly integrated, synchronized, and updated via the wireless network 200 with the mobile device subscriber's corresponding data items stored and/or associated with a host computer system. This functionality creates a mirrored host computer on the mobile device 100 with respect to such items. This can be particularly advantageous when the host computer system is the mobile device subscriber's office computer system.

Additional applications can also be loaded onto the mobile device 100 through at least one of the wireless network 200, the auxiliary I/O subsystem 112, the data port 114, the short-range communications subsystem 122, or any other suitable device subsystem 124. This flexibility in application installation increases the functionality of the mobile device 100 and can provide enhanced on-device functions, communication-related functions, or both. For example, secure communication applications can enable electronic commerce functions and other such financial transactions to be performed using the mobile device 100.

In some embodiments, one or more AR applications 178 may be loaded onto the mobile device 100. AR applications 178 may be configured to provide various augmented reality experiences, such as navigation aids, gaming, advertising, and the like.

The data port 114 enables a subscriber to set preferences through an external device or software application and extends the capabilities of the mobile device 100 by providing for information or software downloads to the mobile device 100 other than through a wireless communication network. The alternate download path can, for example, be used to load an encryption key onto the mobile device 100 through a direct and thus reliable and trusted connection to provide secure device communication.

The data port 114 can be any suitable port that enables data communication between the mobile device 100 and another computing device. The data port 114 can be a serial or a parallel port. In some instances, the data port 114 can be a USB port that includes data lines for data transfer and a supply line that can provide a charging current to charge the mobile device 100.

The short-range communications subsystem 122 provides for communication between the mobile device 100 and different systems or devices, without the use of the wireless network 200. For example, the subsystem 122 can include an infrared device and associated circuits and components for short-range communication. Examples of short-range communication include standards developed by the Infrared Data Association (IrDA), Bluetooth, and the 802.11 family of standards developed by IEEE.

In use, a received signal such as a text message, an e-mail message, or web page download will be processed by the communication subsystem 104 and input to the microprocessor 102. The microprocessor 102 will then process the received signal for output to the display 110 or alternatively to the auxiliary I/O subsystem 112. A subscriber can also compose data items, such as e-mail messages, for example, using the keyboard 116 in conjunction with the display 110 and possibly the auxiliary I/O subsystem 112. The auxiliary subsystem 112 can include devices such as a touch screen, mouse, track ball, infrared fingerprint detector, or a roller wheel with dynamic button pressing capability. The keyboard 116 is preferably an alphanumeric keyboard and/or telephone-type keypad. However, other types of keyboards can also be used. A composed item can be transmitted over the wireless network 200 through the communication subsystem 104.

For voice communications, the overall operation of the mobile device 100 is substantially similar, except that the received signals may be output to the speaker 118, and signals for transmission are generated by the microphone 120. Alternative voice or audio I/O subsystems, such as a voice message recording subsystem, can also be implemented on the mobile device 100. Although voice or audio signal output is accomplished primarily through the speaker 118, the display 110 can also be used to provide additional information such as the identity of a calling party, duration of a voice call, or other voice call related information.

The mobile device 100 also includes a camera unit 148 that allows a user of the mobile device 100 to capture images and videos. The camera unit 148 can include a camera controller 150, a current drive unit 152, a camera lens sub-unit 154, a camera flash sub-unit 156, a camera sensor sub-unit 158 and an image capture input 160. The camera controller 150 configures the operation of the camera unit 148 in conjunction with information and instructions received from the microprocessor 102 and the camera module 138. It should be noted that the structure shown for the camera unit 148 and the associated description is only an example embodiment and that the technique of obtaining camera images for viewing on the display 110 should not be limited to this example embodiment.

In a still image mode, the camera controller 150 may receive an activation signal from the microprocessor 102 when a user selects the camera still image mode for the mobile device 100. If artificial illumination is needed, the camera unit 148 then determines the maximum camera flash current that can be drawn from the battery unit 130 as well as the magnitude of light that needs to be produced by the camera flash for the current physical surroundings of the mobile device 100 so that a good quality picture is taken of the scene; in this regard, various techniques known to those skilled in the art can be employed. For example, current pulses of varying lengths may be used to generate the camera flash. Alternatively, a constant pulse length can be used along with a maximum amplitude setting and other elements can be varied, such as the aperture of the lens, to have the intended effect of a camera flash having a different light output. In at least some embodiments, the live image mode can be used in conjunction with an AR application 178.

The camera flash sub-unit 156 includes a camera flash to generate light having an appropriate magnitude or lumen to increase the quality of the images that are obtained by the camera unit 148. However, the output of the camera flash sub-unit 156 is limited due to the limit on the current that can be drawn from the battery unit 130 for flash purposes (the limit is specified by the maximum camera flash current). The camera flash sub-unit 156 is typically based on light emitting diode (LED) flash technology. In alternative embodiments, other types of appropriate flashes can be used.

In a live image mode, the camera controller 150 may receive an activation signal from the microprocessor 102 when a user selects the camera live image mode (e.g., video mode) for the mobile device 100. Depending on several factors, microprocessor 102 may determine that camera flash sub-unit 156 can be deactivated or, alternatively, operate continuously to illuminate a scene. In the live image mode, camera sub-unit 158 may continuously capture images, which can be rendered in real-time on display 110 of the mobile device. In at least some embodiments, the live image mode can be used in conjunction with an AR application 178.

Depending on the particular configuration that is employed, the camera lens sub-unit 154 includes a lens along with a shutter and/or aperture along with components to open and close the shutter and/or aperture. Alternatively, the camera lens sub-unit 154 can include components that provide telescopic functionality to allow the user to take a "zoomed-in" or "zoomed-out" picture. In other alternatives, the camera lens sub-unit 154 can include all of these components. The structure used for each of these alternatives is known to those skilled in the art.

In both still image and live image modes, the camera sensor sub-unit 158 captures image data and sends the image data to the camera controller 150. The camera sensor sub-unit 158 can be based on CMOS integrated circuit technology, or other integrated circuit technology capable of providing image sensing. The camera controller 150 converts the image data into a desired format such as JPEG image data or MPEG video data, which may be stored in a memory element of the mobile device 100, such as the RAM 106, or displayed immediately such as on display 110, as described herein.

Image capture input 160 may be received from, for example, a push-button actuator that is depressed by the user when the user wishes to take a picture. In other embodiments, the image capture input 160 can originate from the activation of a switch, a virtual button displayed on a screen or some other appropriate input mechanism as known by those skilled in the art, capable of activating a still image mode or a live image mode.

In use, the user selects the camera mode for the mobile device 100, and the camera controller 150 operates the camera unit 148 to continuously take images, and continually generate the Joint Photographic Experts Group (JPEG) or Moving Picture Experts Group (MPEG) data for a sequence of frames. The raw image data for each frame is then obtained and processed by the microprocessor 102, or another suitable processor in alternative embodiments, in order to generate preprocessed image data which is displayed on the display 110. The display 110 is continually updated with the processed image data of subsequent frames. When used in conjunction with an AR application 178, microprocessor 102 may generate elements to be inserted or overlaid into the sequence of frames, as described herein with reference to at least one embodiment.

In at least some embodiments, camera sensor sub-unit 158 may comprise an image sensor 162 and one or more inertial navigation sensors, such as a gyroscope 168, accelerometer 170, magnetometer 172, altimeter 167, an integrated controller 164 and a memory 166. Memory 166 may store calibration parameters or sensor readings associated with one or more sensor, for example. In at least some other embodiments, image sensor 162 and the one or more inertial navigation sensors may not be part of camera sensor sub-unit 158.

Gyroscope 168, in at least one example embodiment, comprises a gyroscopic sensor integrated into camera sensor sub-unit 158, which, when operable, obtains or otherwise acquires readings including rotation of the sensor relative to one or more axes. Such readings can be stored in a data store, such as memory 166. Various applications, such as AR application 178, may utilize the stored gyroscopic sensor readings. In one example, an image stabilization application can utilize the stored gyroscope sensor readings to determine when captured images were accompanied by movement (i.e., rotation) of the mobile device. It can be appreciated that other applications may also make use of gyroscopic readings, including for example, a game, etc. The applications may use such readings to provide a user interface (UI) on display 110. The gyroscope 168, in at least one example embodiment, also comprises or otherwise has access to a gyroscope calibration module (not shown) which, as will be discussed below, can be used to calibrate the gyroscopic sensor to improve the quality of the gyroscopic sensor readings.

Accelerometer 170 in at least one example embodiment comprises an accelerometer sensor integrated into camera sensor sub-unit 158, which, when operable, obtains or otherwise acquires readings including the acceleration of an inertial reference frame relative to the accelerometer. Such readings can be stored in a data store, such as memory 166. Various applications, such as AR application 178, may utilize the stored accelerometer sensor readings. In one example, an AR application can utilize the stored accelerometer sensor readings to determine the orientation of display 110 (e.g., portrait or landscape on a rectangular display type) and rotate the rendered images accordingly for a user's convenience. It can be appreciated that other applications may also make use of accelerometer readings, including for example, AR, a game, orientation sensing, etc. The applications may provide such readings in a user interface (UI) on display 110. The accelerometer 170, in at least one example embodiment, also comprises or otherwise has access to an accelerometer calibration module (not shown) which, as will be discussed below, can be used to calibrate the accelerometer sensor to improve the quality of the accelerometer sensor readings.

Magnetometer 172 in at least one example embodiment comprises a three-axis magnetometer sensor integrated into camera sensor sub-unit 158, which, when operable, obtains or otherwise acquires readings including the strength and direction of a magnetic field. Such readings can be stored in a data store, such as memory 166. Various applications, such as AR application 178, may utilize the stored magnetometer sensor readings. In one example, an AR application can utilize the stored magnetometer sensor readings to determine and display a compass heading. It can be appreciated that other applications may also make use of magnetometer readings, including for example, a stud finder application, metal detector application, etc. The applications may provide such readings in a user interface (UI) on display 110, e.g. a real-time compass showing the mobile device's heading. The magnetometer 172, in at least one example embodiment, also comprises or otherwise has access to a magnetometer calibration module (not shown) which, as will be discussed below, can be used to calibrate the magnetometer sensor to improve the quality of the magnetometer sensor readings.

In some embodiments, various additional sensors may also be provided, optionally as part of camera sensor sub-unit 158. For example, additional sensors may include an absolute pressure sensor (e.g., altimeter).

A GPS unit 169 may also be provided on mobile device 100, optionally as part of camera sensor sub-unit 158. GPS unit 169 is operable to obtain or otherwise acquire position data such as, for example, longitude, latitude and elevation using a global navigation satellite system such as the Global Positioning System, Galileo, GLONASS or the like. Such data can be stored in a data store, such as memory 108. Various applications may utilize the stored GPS unit data.

Integrated controller 164 may provide an interface, e.g., for microprocessor 102, to each of the inertial navigation sensors and, in some embodiments, to image sensor 162.

Figure 2:
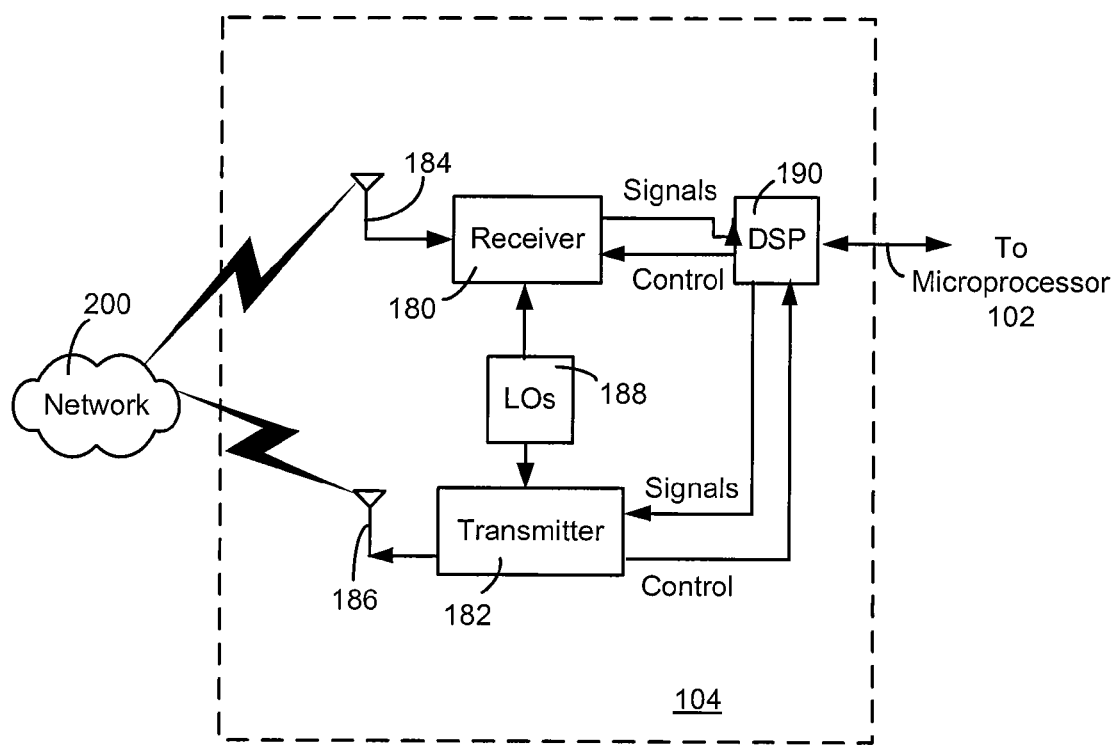
FIG. 2 is a block diagram of an example embodiment of a communication subsystem component of the mobile device of FIG. 1.

Referring now to FIG. 2, a block diagram of the communication subsystem component 104 of FIG. 1 is shown. Communication subsystem 104 comprises a receiver 180, a transmitter 182, one or more embedded or internal antenna elements 184, 186, Local Oscillators (LOs) 188, and a processing module such as a Digital Signal Processor (DSP) 190.

The particular design of the communication subsystem 104 may be dependent upon the network 200 in which the mobile device 100 is intended to operate. It should be understood that the design illustrated in FIG. 2 serves only as one example. Signals received by the antenna 184 through the network 200 are input to the receiver 180, which may perform such common receiver functions as signal amplification, frequency down conversion, filtering, channel selection, and analog-to-digital (A/D) conversion. A/D conversion of a received signal allows more complex communication techniques such as demodulation and decoding to be performed in the DSP 190. In a similar manner, signals to be transmitted are processed, including modulation and encoding, by the DSP 190. These DSP-processed signals are input to the transmitter 182 for digital-to-analog (D/A) conversion, frequency up conversion, filtering, amplification and transmission over the network 200 via the antenna 186. The DSP 190 not only processes communication signals, but also provides for receiver and transmitter control. For example, the gains applied to communication signals in the receiver 180 and the transmitter 182 may be adaptively controlled through automatic gain control algorithms implemented in the DSP 190.

The wireless link between the mobile device 100 and a network 200 may contain one or more different channels, typically different RF channels, and associated protocols used between the mobile device 100 and the network 200. An RF channel is a limited resource that must be conserved, typically due to limits in overall bandwidth and limited battery power of the mobile device 100.

When the mobile device 100 is fully operational, the transmitter 182 is typically keyed or turned on only when it is sending to the network 200 and is otherwise turned off to conserve resources. Similarly, the receiver 180 is periodically turned off to conserve power until it is needed to receive signals or information (if at all) during designated time periods.

Figure 3:
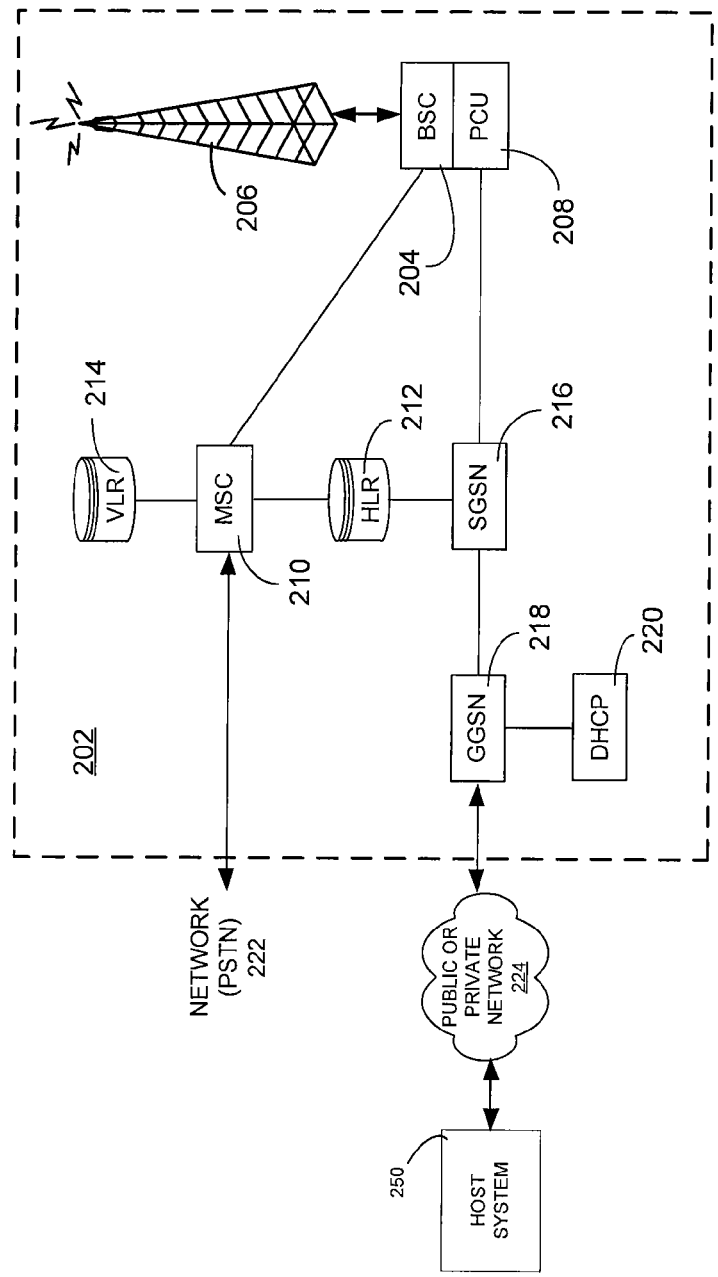
FIG. 3 is a block diagram of a node of a wireless network in one example embodiment.

Referring now to FIG. 3, a block diagram of a node of a wireless network is shown as 202. In this example embodiment, the network and its components are described for operation with General Packet Radio Service (GPRS) and Global Systems for Mobile (GSM) technologies. However, it should be understood that in other embodiments the network can be implemented in accordance with other communication protocols. In practice, the network 200 comprises one or more nodes 202. The mobile device 100 communicates with a node 202 within the wireless network 200. The node 202 is configured in accordance with GPRS and GSM technologies. The node 202 includes a base station controller (BSC) 204 with an associated tower station 206, a Packet Control Unit (PCU) 208 added for GPRS support in GSM, a Mobile Switching Center (MSC) 210, a Home Location Register (HLR) 212, a Visitor Location Registry (VLR) 214, a Serving GPRS Support Node (SGSN) 216, a Gateway GPRS Support Node (GGSN) 218, and a Dynamic Host Configuration Protocol (DHCP) 220. This list of components is not meant to be an exhaustive list of the components of every node 202 within a GSM/GPRS network, but rather a list of components that are commonly used in communications through the network 200.

In a GSM network, the MSC 210 is coupled to the BSC 204 and to a landline network, such as a Public Switched Telephone Network (PSTN) 222 to satisfy circuit switched requirements. The connection through the PCU 208, the SGSN 216 and the GGSN 218 to the public or private network (Internet) 224 (also referred to herein generally as a shared network infrastructure) represents the data path for GPRS capable mobile devices. In a GSM network extended with GPRS capabilities, the BSC 204 also contains a Packet Control Unit (PCU) 208 that connects to the SGSN 216 to control segmentation, radio channel allocation and to satisfy packet switched requirements. To track mobile device location and availability for both circuit switched and packet switched management, the HLR 212 is shared between the MSC 210 and the SGSN 216. Access to the VLR 214 is controlled by the MSC 210.

The station 206 may be a fixed transceiver station in which case the station 206 and the BSC 204 together form the fixed transceiver equipment. The fixed transceiver equipment provides wireless network coverage for a particular coverage area commonly referred to as a "cell". The fixed transceiver equipment transmits communication signals to and receives communication signals from mobile devices within its cell via the station 206. The fixed transceiver equipment normally performs such functions as modulation and possibly encoding and/or encryption of signals to be transmitted to the mobile device in accordance with particular, usually predetermined, communication protocols and parameters, under control of its controller. The fixed transceiver equipment similarly demodulates and possibly decodes and decrypts, if necessary, any communication signals received from the mobile device 100 within its cell. Communication protocols and parameters may vary between different nodes. For example, one node may employ a different modulation scheme and operate at different frequencies than other nodes.

For all mobile devices 100 registered with a specific network, permanent configuration data such as a user profile is stored in the HLR 212. The HLR 212 also contains location information for each registered mobile device and can be queried to determine the current location of a mobile device. The MSC 210 is responsible for a group of location areas and stores the data of the mobile devices currently in its area of responsibility in the VLR 214. Further the VLR 214 also contains information on mobile devices that are visiting other networks. The information in the VLR 214 includes part of the permanent mobile device data transmitted from the HLR 212 to the VLR 214 for faster access. By moving additional information from a remote node of the HLR 212 to the VLR 214, the amount of traffic between these nodes can be reduced so that voice and data services can be provided with faster response times while at the same time using less computing resources.

The SGSN 216 and the GGSN 218 are elements added for GPRS support; namely packet switched data support, within GSM. The SGSN 216 and the MSC 210 have similar responsibilities within wireless network 200 by keeping track of the location of each mobile device 100. The SGSN 216 also performs security functions and access control for data traffic on the network 200. The GGSN 218 provides internetworking connections with external packet switched networks and connects to one or more SGSN's 216 via an Internet Protocol (IP) backbone network operated within the network 200. During normal operations, a given mobile device 100 generally performs a "GPRS Attach" to acquire an IP address and to access data services. This is not present in circuit switched voice channels as Integrated Services Digital Network (ISDN) addresses are used for routing incoming and outgoing calls. Currently, GPRS capable networks use private, dynamically assigned IP addresses and thus use a DHCP server 220 connected to the GGSN 218. There are many mechanisms for dynamic IP assignment, including using a combination of a Remote Authentication Dial-In User Service (RADIUS) server and a DHCP server. Once the GPRS Attach is complete, a logical connection is established from a mobile device 100, through the PCU 208 and the SGSN 216 to an Access Point Node (APN) within the GGSN 218. The APN represents a logical end of an IP tunnel that can either access direct Internet compatible services or private network connections. The APN also represents a security mechanism for the network 200, insofar as each mobile device 100 must be assigned to one or more APNs and the mobile devices 100 cannot exchange data without first performing a GPRS Attach to an APN that it has been authorized to use. The APN may be considered to be similar to an Internet domain name such as "myconnection.wireless.com".

Once the GPRS Attach is complete, a tunnel is created and traffic is exchanged within standard IP packets using any protocol that can be supported in IP packets. This includes tunneling methods such as IP over IP as in the case with some IPSecurity (IPsec) connections used with Virtual Private Networks (VPN). These tunnels are also referred to as Packet Data Protocol (PDP) Contexts and there are a limited number of these available in the network 200. To maximize use of the PDP Contexts, the network 200 will run an idle timer for each PDP Context to determine if there is a lack of activity. When a mobile device 100 is not using its PDP Context, the PDP Context can be deallocated and the IP address returned to the IP address pool managed by the DHCP server 220.

The host system 250 may be a corporate enterprise or other local area network (LAN), but may also be a home office computer or some other private system, for example. In some cases, the host system 250 may represent a smaller part of a larger network of an organization. Typically, mobile devices communicate wirelessly with the host system 250 through one or more of the nodes 202 of the wireless network 200. The host system 250 may include one or more routers and computing devices that may operate from behind a firewall or proxy server. The proxy server routes data to the correct destination server(s) within the host system 250. For instance, the host system 250 may include a message server to send and receive messages to the mobile devices and a message management server that controls when, if, and how messages are sent to the mobile devices. The host system 250 can also include other servers that provide various functions for the host system 250 as well as data stores or databases.

An integrated circuit (IC), sometimes called a chip or microchip, may comprise an electronic circuit manufactured by the patterned diffusion of trace elements into the surface of a thin substrate of semiconductor material. Additional materials, such as aluminum or other metal, may be deposited and patterned to form interconnections between semiconductor devices. Typically, semiconductor ICs are fabricated in a process employing three primary steps: imaging, deposition and etching. These primary steps may be supplemented by additional steps such as doping and cleaning.

In one common type of IC (CMOS), crystalline silicon wafers are used as the substrate. Lithographic techniques (e.g., photolithography, x-ray lithography) may be used to cause different areas of the substrate to be doped or to have polysilicon, insulators or metal (e.g., aluminum) patterns deposited on them.

Integrated circuits are typically fabricated, or built-up, with many overlapping layers. Each overlapping layer is successively defined by a repeated process of imaging, deposition and etching. Some layers mark where various dopants are diffused into the substrate (e.g., diffusion layers), some define where additional ions are implanted (implant layers), some define the conductors (e.g., polysilicon or metal layers), and some define the connections between the conducting layers (e.g., via or contact layers). This layered process can be controlled to precisely form uniform structures with well-defined features.

In some cases, integrated circuit fabrication techniques may also be used directly, or with some modification, to fabricate MEMS structures.

Once fabricated, the integrated circuit wafer may be cut into a plurality of integrated circuit dice, with each die representing a completed, fabricated integrated circuit. The individual dice may then be placed into and/or attached to a suitable integrated circuit package or assembly, for encapsulation by the package.

Examples of package types include surface mount, ceramic flat pack, small-outline integrated circuit (SOIC), land grid array (LGA), plastic leaded chip carrier (PLCC), etc. A multiple die package may sometimes be referred to as a System in Package (SiP). Other types of suitable packages may also be used. The inertial navigation sensors can be packaged in an image sensor package, and optionally calibrated as a system, before or after incorporation into a mobile device.

Attachment of an integrated circuit die to the integrated circuit package is the process of mounting and fixing the die to the package or a support structure (e.g., header). For example, the die may be: attached to the package using an adhesive or bonding agent such as glue or solder, mechanically fixed, or otherwise fixed.

Wire-bonding, flip-chip bonding or other suitable techniques may be used to provide the necessary electrical connections between the integrated circuit die and the exterior conductive leads or pads of the package. Subsequently, the package may be fully or partially sealed, if desired, to protect the sensitive die from environmental factors.

Employing integrated circuit fabrication techniques, an image sensor, such as an active pixel sensor (APS) can be formed. An APS may comprise a CMOS integrated circuit containing an array of pixel sensors, each pixel comprising a photodetector and an active amplifier. Accordingly, in some embodiments, image sensor 162 may be an APS.

Similarly, integrated circuit fabrication techniques may also be used to fabricate various other sensors, including inertial navigation sensors such as accelerometers, gyroscopes, altimeters and magnetometers. As noted herein, depending on the type of sensor, the specific fabrication steps may differ.

In at least some embodiments, by combining and adapting disparate fabrication techniques in a single integrated process, a combined image sensor and inertial navigation sensor can be fabricated on a single integrated circuit. In particular, a single process technology (e.g., 45 nm CMOS) can be used.

In other embodiments, the difficulties of manufacturing a fully-calibrated inertial sensor array for a mobile device can be alleviated by combining discrete inertial sensor integrated circuits in a single package. The dice for individual inertial navigation sensors can be precisely placed and aligned within a single package. For example, flip-chip or other die stacking techniques (e.g., the process of mounting one or more integrated circuit dice on top of each other) can be used to place and align each sensor die atop another. Other techniques of placing and aligning may also be used.

Figure 4A:
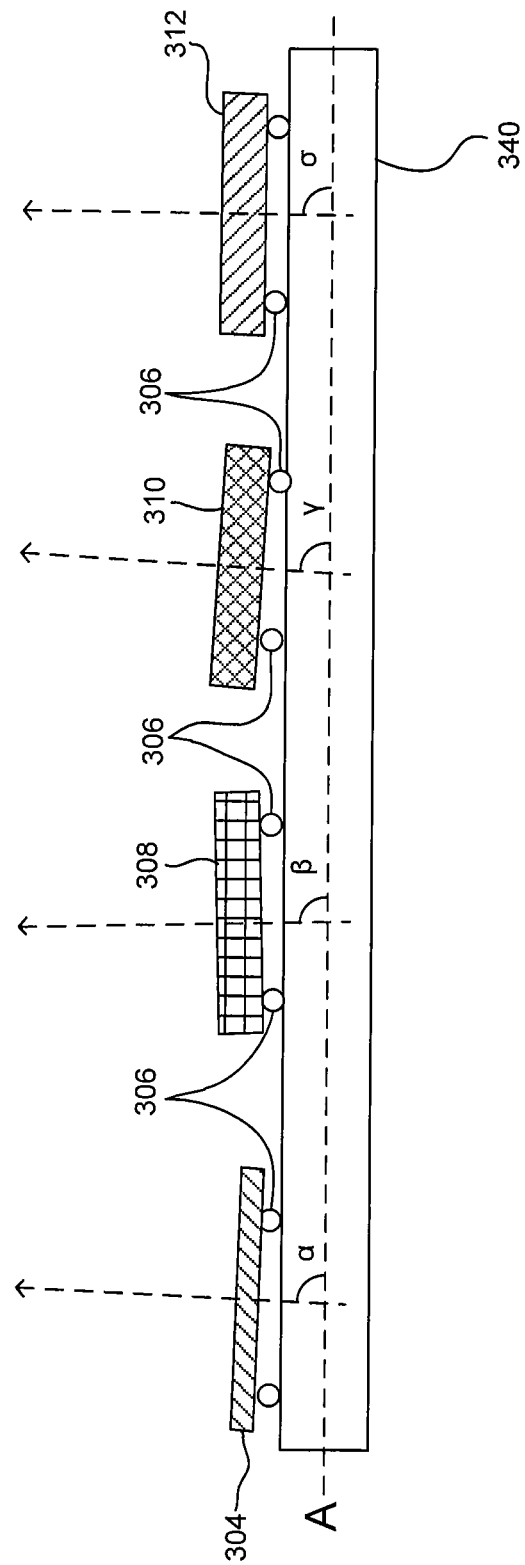
FIG. 4A is a sectional view of a conventional printed circuit board.

Referring now to FIG. 4A, there is shown a sectional view of a conventional printed circuit board (PCB) including an image sensor 304 and inertial navigation sensors. PCB 340 defines an axis A running parallel to its length and width. Axis A may also be an axis of an external coordinate system or frame of reference, in which the remaining axes are mutually orthogonal. For ease of description, a three-dimensional set of axes may be chosen relative to the PCB, in which the x- and y-axes form a plane parallel to the PCB, and in which the z-axis passes through the PCB orthogonally to both the x- and y-axes. In such a system, axis A may correspond to the x- or y-axis.

Image sensor 304, accelerometer 308, gyroscope 310 and magnetometer 312 are each mounted to PCB 340 via solder beads 306. For the purposes of illustration, only two solder beads are shown in this view for each sensor, however it will be appreciated that sensors can have a plurality of electrical contacts, and each electrical contact of each sensor may have its own solder bead, resulting in a large number of solder connections. In some other known PCBs, a socket may be soldered to the PCB and each sensor may be inserted into the socket (not shown).

By virtue of the mechanical placement of each sensor onto PCB 340, and due to the difficulty in precisely measuring solder amounts and ensuring uniform soldering, each sensor may be tilted relative to axis A of PCB 340. For example, consider an angle $\alpha$ formed between the line normal to the focal plane of imaging sensor 304 and axis A. Ideally, angle $\alpha$ should be 90°. However, due to the difficulty in precisely mounting and soldering, angle $\alpha$ may be in the range of 88-92°. A deviation of approximately 1-2° from the right angle is common.

Similarly, accelerometer 308, gyroscope 310 and magnetometer 312 may each exhibit respective deviation angles $\beta$, $\gamma$ and $\sigma$.

Relatedly, when seen in a plan view of the PCB, each sensor may be inadvertently rotated about the z-axis (i.e., relative to a desired geometry), for example due to uneven surface tension forces acting on the package during soldering.

Figure 4B:
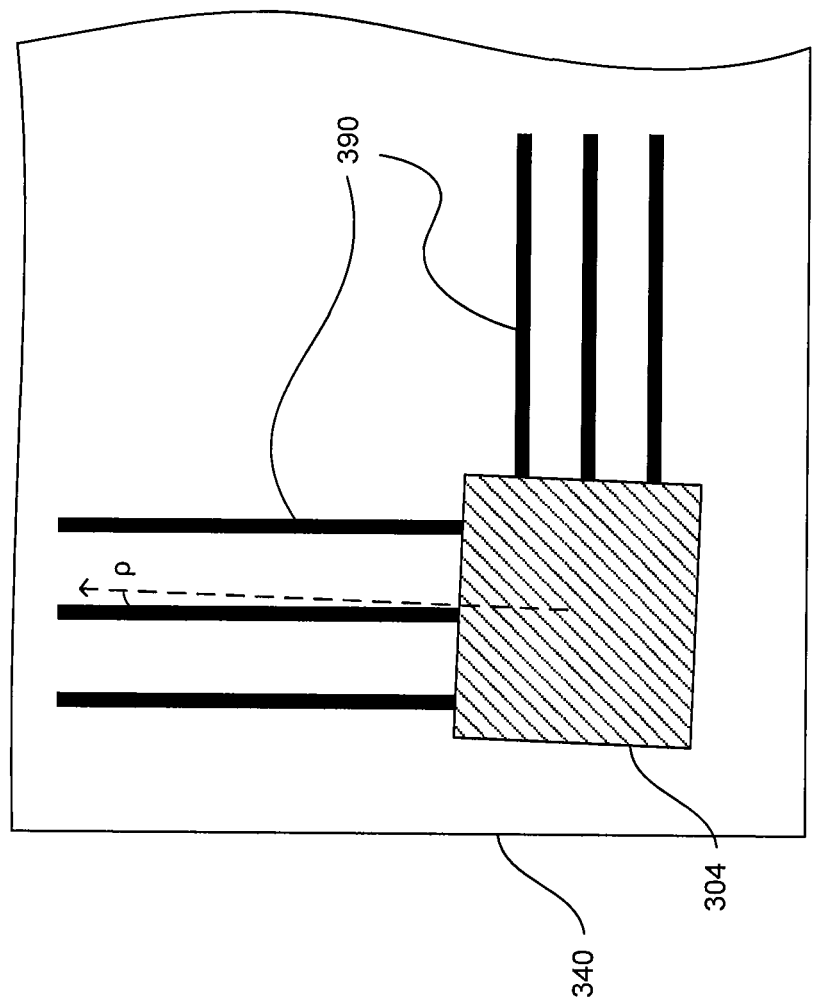
FIG. 4B is a partial plan view of the conventional printed circuit board of FIG. 4A.

Referring now to FIG. 4B, there is shown a plan view of image sensor 304 mounted on PCB 340 (shown in partial view), in which image sensor 304 is rotated about the z-axis (using the set of axes described for FIG. 4A). Image sensor 304 is shown rotated by an angle $\rho$ from the orthogonal axes defined by at least one of conductor traces 390.

In some other cases, sensors may be placed onto one or more PCBs or housings of a mobile device, which may further complicate alignment. For example, a camera may be placed in a rear housing of the mobile device and an accelerometer on a PCB of the mobile device.

If each sensor is calibrated independently, the result may be that each has a different alignment, rotation and orientation relative to a common coordinate space (e.g., defined in part by the plane of the printed circuit board) and therefore each other. For example, the image sensor may "point" in one direction, while the magnetometer may "point" in a different direction. Similarly, the magnetometer may be rotated relative to the image sensor.

This difference in orientation can be problematic in many applications involving navigation and AR, which may require a greater degree of accuracy and precision. For example, in one AR application, microprocessor 102 may be configured to use magnetometer and gyroscope readings to determine in which direction a mobile device is oriented and the azimuth angle formed by a camera of the device. Coupled with GPS location information, the AR application can then determine what should be in the scene captured by the camera and overlay images onto a live image provided by the camera. For example, the overlay may be an advertisement, which is to be aligned with the position of a retail establishment as it appears in the live image.

However, if the imaging sensor is not aligned with the inertial navigation sensors, then bearing error may cause the flashing indicator to be poorly aligned or to appear in the wrong position altogether. For example, an advertisement overlay may not be aligned with the area on the storefront on which the advertisement is intended to be displayed.

At small distances from the mobile device, bearing error may not be significant. But at larger distances, even relatively small bearing errors may result in significant alignment problems. For example, at a distance of 5 meters, a bearing error of 5° between the imaging sensor and magnetometer may result in a lateral deviation of approximately 44 centimeters. However, at a distance of 30 meters, the same bearing error may increase to 2.6 meters, for example.

In cases where sensors are provided in discrete packages, particularly where a socket is used, each individually-packaged sensor may shift following initial assembly and calibration. For example, if the mobile device is dropped or otherwise subjected to a physical shock, the sensor may be dislodged from the position in which it was calibrated. Subsequently, re-calibration may be required to restore proper performance and accuracy.

In addition, in current devices, each individual image and inertial navigation sensor may be produced by a different manufacturer and packaged separately, increasing both the PCB area required to house the sensor, and assembly costs.

Referring now to FIG. 5A, there is shown a sectional view of an example integrated circuit manufactured in accordance with at least one embodiment. Integrated circuit 400 comprises an imaging sensor 404 and one or more inertial navigation sensors, such as accelerometer 408, gyroscope 410 and magnetometer 412. Each inertial navigation sensor is fabricated using IC fabrication techniques on the same substrate of, for example, a first integrated circuit die. The first integrated circuit die can be attached to and encapsulated within a single package 405, as described herein.

As each sensor is fabricated on the same substrate, using lithographic techniques as an example, alignment of each sensor on the common substrate can be maintained within precise tolerances, for example less than 0.1° difference. Similarly, each sensor can be aligned relative to a z-axis (i.e., orthogonal to the substrate plane), such that there is little or no relative rotation of the sensors, by virtue of lithographic patterning. Accordingly, imaging sensor 404 and each inertial navigation sensor can be substantially aligned along each and/or every axis of the integrated circuit. For example, in the illustrated example, imaging sensor 404, accelerometer 408, gyroscope 410 and magnetometer 412 are each aligned with an axis B running parallel to the length and width of integrated circuit 400, which is itself parallel with the integrated circuit substrate plane.

Likewise, the focal plane of imaging sensor 404 is substantially parallel to the substrate plane of integrated circuit 400 because imaging sensor 404 is fabricated on the substrate using, for example, lithographic fabrication techniques. Using such techniques, the focal plane can be parallel to the substrate plane to about 0.5° to 0.1° deviation, or less.

Referring now to FIG. 5B, there is shown a sectional view of a single package sensor in accordance with at least one embodiment. Single package sensor 450 comprises an imaging sensor 404' and one or more inertial navigation sensors, such as accelerometer 408', gyroscope 410' and magnetometer 412' mounted within a single package 455. Each inertial navigation sensor can be fabricated on a separate integrated circuit using IC fabrication techniques. For example, the image sensor may be fabricated on a first integrated circuit die and each additional navigation sensor can be fabricated on at least one additional integrated circuit die. In some cases, one or more sensors may be combined on a single die, while other sensors remain on separate dice.

Die stacking techniques can be used to arrange the individual integrated circuit dies comprising the inertial navigation sensors and imaging sensor. Accordingly, the combined sensor array can be attached to and encapsulated within a single integrated circuit package 455.

Using die stacking techniques, each imaging sensor and each inertial navigation sensor can be substantially aligned along one or more axes, similarly to integrated circuit 400 of FIG. 5A. For example, the planes defined by the respective substrates of each sensor can be made substantially parallel within a small tolerance (e.g., less than 0.1° difference). Likewise, each die can be stacked to substantially align the corners of each die and thus align the dies rotationally about a z-axis.

In some variant embodiments, one or more dice may be attached to and encapsulated within a single package without the use of die stacking. For example, the dice may be attached to the package using an adhesive and, for example, wire-bonded independently. Although this may result in less accurate alignment of the dice, a reduction in alignment error may still be realized as compared to the scenario in which multiple dice are each packaged independently.

Referring now to FIG. 6, there is shown a flow chart illustrating a conventional process, shown generally as process 500, for manufacturing and calibrating camera and inertial navigation sensor (INS) modules for a mobile device.

Calibration process 500 begins at 502 by mounting sensors to a PCB, for example by soldering or by fitting the sensors to a socket provided for mounting the sensors. Optionally, the PCB may be secured to a mobile device, for example by fittingly engaging the PCB in a mating structure, fastening, bonding or otherwise.

At 508, each of the imaging and INS sensors may be individually calibrated. The calibration process for each individual sensor may vary, according to its respective function. For example, an accelerometer may be rotated through a known sequence of positions, while subject to constant acceleration (e.g., Earth gravity), and a calibration result computed from output measurements obtained for each rotation. In another example, a magnetometer may be placed in a Helmholtz coil, which can be used to generate various magnetic fields, and the calibration result computed from the response of the magnetometer to the various magnetic fields. In another example, a gyroscope may be rotated at a constant angular velocity through a known sequence of positions, and a calibration result computed from output measurements obtained during the rotation. In another example, an image sensor may be trained and focused on optical charts at a known distance (e.g., using a precision fixture), and the captured images may be processed to calibrate the alignment of the image sensor.

In one example calibration procedure, the PCB may be positioned and aligned in a fixed frame within an instrument with a reference magnetometer. Measurements from the magnetometer under test (i.e., mounted on the PCB) may then be compared with measurements from the reference magnetometer, to identify differences and thus the degree of shift or tilt in the mounting of the magnetometer under test.

The calibration results obtained at 508 for each sensor are stored in a memory, for example memory 106, at 510. In general, the output of each inertial navigation sensor may comprise one or more numerical values, which can be used to determine a "real world" position or orientation or physical property. Similarly, the calibration results may reflect numerical values such as scaling factors, offsets and the like.

Accordingly, when measurements are subsequently obtained from the individual sensors, they can be adjusted based on the calibration results to reflect the actual orientation or position of the PCB, rather than the internal coordinate system of the individual sensors, which may differ from that of the PCB, for example by angle $\alpha$, $\beta$, $\gamma$ or $\sigma$.

Figure 7:
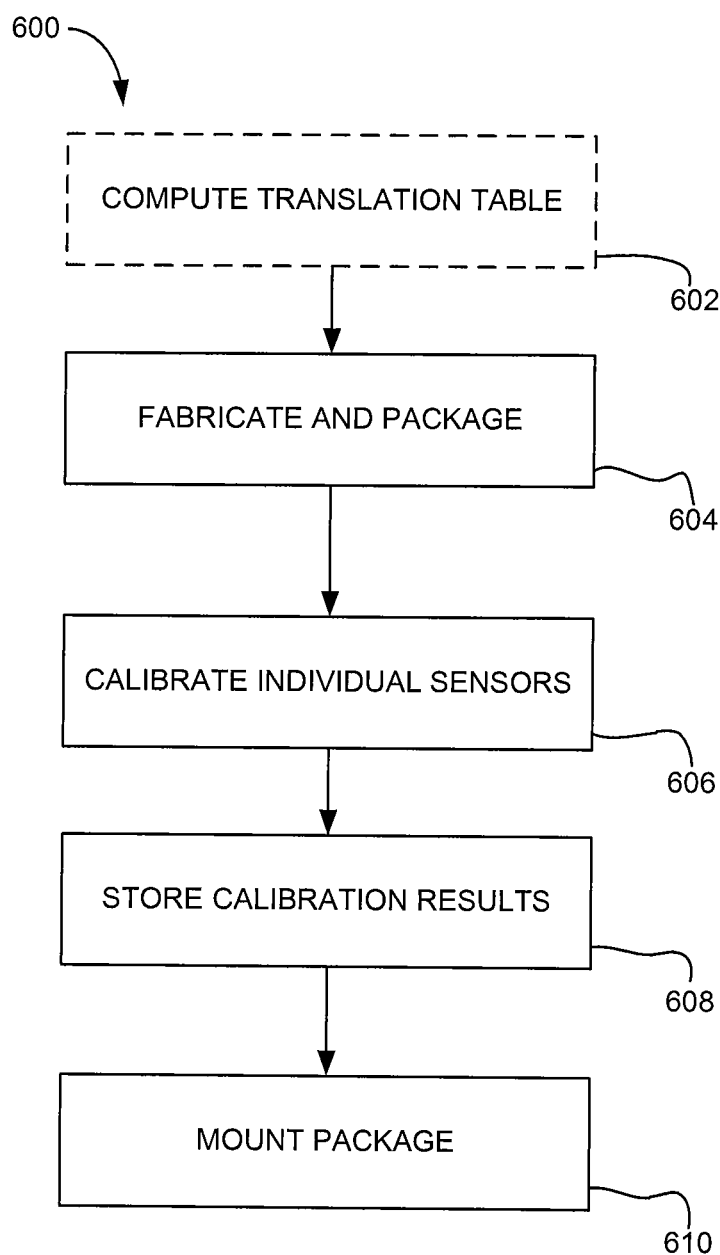
FIG. 7 is a flow chart illustrating a process for manufacturing and calibrating a single package imaging and inertial navigation sensor, in accordance with at least one embodiment.

Referring now to FIG. 7, there is shown a flow chart illustrating a process for manufacturing and calibrating a single package imaging and INS sensor array, in accordance with at least one embodiment.

As described herein, the placement of the single package imaging and INS sensor on a PCB or housing of the mobile device may result in a "y-axis" of the sensor not corresponding to a "y-axis" of the mobile device. For example, in one common three-axis convention for defining directions relative to a mobile device, a y-axis may be defined as passing through the mobile device in a positive direction from the mouthpiece area through an earpiece area (e.g., when held by a user), an x-axis may be defined as passing through the mobile device in a positive direction from left to right on a keyboard (e.g., from the 'q' key to the 'p' key on a QWERTY keyboard) of the mobile device, and a z-axis may be defined as an axis that passes through the mobile device orthogonally to the x- and y-axes (e.g., positive direction toward a user).

However, if the sensor package is positioned on the PCB or housing such that the "y-axis" of the sensor corresponds to the "x-axis" of the mobile device according to the above convention, then further adjustment of the output results from the sensor may be required.

Accordingly, a translation table may be provided by the mobile device to "map" the output values of the sensor package to the appropriate axes. For example, if a sensor outputs three numerical values corresponding to three axes (as defined relative to the sensor package), the translation table may specify which of the three numerical values correspond to the x-, y- and z-axes of the mobile device, respectively, along with any changes in sign (i.e., negative or positive) due to reversed direction. The translation table may be used similarly to map polar and other coordinate systems, depending on the sensor package output format. In some cases, the translation table may be augmented following calibration of the sensor package to incorporate calibration results. Accordingly, the raw sensor output can be modified using the translation table to provide accurate output relative to the mobile device, rather than the sensor package itself.

At 602, the physical layout of the PCB or housing, and the specific orientation and rotation of the single package sensor array is computed.

Due to the inherent ability of integrated circuit fabrication and die stacking techniques to reliably and precisely position each sensor relative to each other, the translation table may be computed prior to mounting of the sensor package within the mobile device, and without a further calibration step for the group of sensors once the sensor package is mounted to a PCB or housing. The translation table can be generated prior to manufacturing of the mobile device, based on the physical layout of the PCB or housing In one example, if it is known from the physical layout of the PCB that the sensor package is positioned such that a positive y-axis of the sensor package corresponds to the positive x-axis of the mobile device, the translation table can be used to determine that, for the purposes of compass measurements, the raw sensor output of the sensor package should be computationally rotated by 90°. Alternatively, if the sensor package outputs data corresponding to separate axes, then the translation table can be used to determine that the y-axis outputs can be treated as the x-axis output.

At 604, the integrated circuit die or dice for an imaging sensor, one or more inertial navigation sensors, a controller and a memory are fabricated and attached and encapsulated within a single package as described herein.

At 606, each imaging and inertial navigation sensor can be calibrated individually. The calibration process for each individual sensor may vary, according to its respective function. For example, the sensor package may be rotated through a known sequence of positions, while subject to constant acceleration (e.g., Earth gravity), and a calibration result computed for the accelerometer from output measurements obtained for each rotation. In another example, the sensor package may be placed in a Helmholtz coil, which can be used to generate various magnetic fields, and the calibration result computed from the response of the magnetometer to the various magnetic fields. In another example, the sensor package may be rotated at a constant angular velocity through a known sequence of positions, and a calibration result computed for the gyroscope from output measurements obtained during the rotation. The calibrations may be controlled and the results computed by respective calibration modules, and the results may be stored in the integrated memory at 608.

At 610, the sensor package may be mounted to a PCB, for example by soldering or by fitting the package to a socket provided for mounting the sensor package. Alternatively, the sensor package may be secured to a mobile device housing, for example by fittingly engaging the sensor package in a mating structure, fastening, bonding or otherwise.

It should be understood that various modifications can be made to the embodiments described and illustrated herein, without departing from the embodiments, the general scope of which is defined in the appended claims.

The invention claimed is:

1. A mobile device comprising:
    a sensor apparatus for use in the mobile device, the sensor apparatus comprising:
        an image sensor;
        at least one navigation sensor, the at least one navigation sensor comprising at least a magnetometer; and
        an integrated circuit package, wherein the integrated circuit package encapsulates the image sensor and the at least one navigation sensor; and
    a memory, the memory storing a translation table, wherein the translation table comprises a mapping of output value axes between the image sensor, the at least one navigation sensor and the mobile device.

2. The mobile device of claim 1, wherein the image sensor is fabricated on a first integrated circuit die.

3. The mobile device of claim 2, wherein the first integrated circuit die is attached to the integrated circuit package.

4. The mobile device of claim 2, wherein the at least one navigation sensor is fabricated on the first integrated circuit die.

5. The mobile device of claim 2, wherein the at least one navigation sensor is fabricated on at least one additional integrated circuit die that is separate from the first integrated circuit die.

6. The mobile device of claim 5, wherein the at least one additional integrated circuit die is stacked with the first integrated circuit die.

7. The mobile device of claim 1, wherein the at least one navigation sensor comprises two or more navigation sensors.

8. The mobile device of claim 1, wherein the at least one navigation sensor comprises at least one additional sensor selected from the group consisting of: a gyroscope, an accelerometer, and an altimeter.

9. A method of manufacturing a sensor apparatus for use in a mobile device, the method comprising:
    fabricating an image sensor;
    fabricating at least one navigation sensor, the at least one navigation sensor comprising at least a magnetometer;
    encapsulating the image sensor and the at least one navigation sensor in an integrated circuit package; and
    computing a translation table wherein the translation table comprises a mapping of output value axes between the image sensor the at least one navigation sensor and the mobile device.

10. The method of claim 9, wherein the image sensor is fabricated on a first integrated circuit die.

11. The method of claim 10, further comprising attaching the first integrated circuit die to the integrated circuit package.

12. The method of claim 10, wherein the at least one navigation sensor is fabricated on the first integrated circuit die.

13. The method of claim 10, wherein the at least one navigation sensor is fabricated on at least one additional integrated circuit die that is separate from the first integrated circuit die.

14. The method of claim 13, wherein the at least one additional integrated circuit die is stacked with the first integrated circuit die.

15. The method of claim 9, wherein the at least one navigation sensor comprises two or more navigation sensors.

16. The method of claim 9, wherein the at least one navigation sensor comprises at least one additional sensor selected from the group consisting of: a gyroscope, an accelerometer, and an altimeter.

17. Use of a sensor apparatus in a mobile device to provide output data to an augmented reality application executed by a processor of the mobile device, the sensor apparatus comprising:
    an image sensor;
    at least one navigation sensor; and
    an integrated circuit package, wherein the integrated circuit package encapsulates the image sensor and the at least one navigation sensor,
wherein the mobile device comprises a memory storing a translation table, wherein the translation table comprises a mapping of output value axes between the image sensor, the at least one navigation sensor and the mobile device.

18. The use of claim 17, wherein the image sensor and the at least one navigation sensor provide the output data.

19. The use of claim 17, wherein the at least one navigation sensor comprises at least one additional sensor selected from the group consisting of: a gyroscope, an accelerometer, a magnetometer and an altimeter.

* * * * *